United States Patent [19]

Oyama

[11] Patent Number: 4,494,814
[45] Date of Patent: Jan. 22, 1985

[54] HEAT DISSIPATING LEAD CONNECTOR FOR SEMICONDUCTOR PACKAGES

[75] Inventor: Terrell A. Oyama, San Jose, Calif.

[73] Assignee: Apple Computer, Inc., Cupertino, Calif.

[21] Appl. No.: 408,147

[22] Filed: Aug. 16, 1982

[51] Int. Cl.³ ............................................. H01R 13/05
[52] U.S. Cl. ............................. 339/112 R; 339/17 CF
[58] Field of Search ............ 339/112 R, 17 C, 17 CF, 339/125 R, 126 R, 126 RS, 128, 210 R, 210 M, 241, 242

[56] References Cited

U.S. PATENT DOCUMENTS

| Re. 29,513 | 1/1978 | Johnson | 339/112 R |
|---|---|---|---|
| 3,670,215 | 6/1972 | Wilken et al. | 174/16 HS |
| 3,850,500 | 11/1974 | Cobaugh et al. | 339/17 C |
| 4,073,561 | 2/1978 | Baranowski | 339/112 R |
| 4,077,687 | 3/1978 | Farag | 339/112 R |
| 4,415,212 | 12/1983 | DePillo | 339 17 C/ |

Primary Examiner—Joseph H. McGlynn
Assistant Examiner—Paula Austin
Attorney, Agent, or Firm—Blakely, Sokoloff, Taylor & Zafman

[57] ABSTRACT

A heat dissipating connector for semiconductor package leads is disclosed. The body of the connector is comprised of two oppositely facing fingers formed from a unitary strip by making a 180 degree bend transverse to the longitudinal axis of the strip. A heat dissipating fin is formed integrally with an edge of one of the fingers, and protrudes substantially perpendicular to the vertical centerline of the heat dissipating connector body. In its installed condition, the facing surfaces of the fingers engage a semiconductor package lead with a spring force urged from the spring configuration of one of the fingers. The integrated circuit electrical lead, when mounted between the engaging surfaces of the oppositely facing fingers, is gripped in place, thereby maintaining a good heat and electrically conductive relationship therewith.

9 Claims, 5 Drawing Figures

U.S. Patent  Jan. 22, 1985  4,494,814
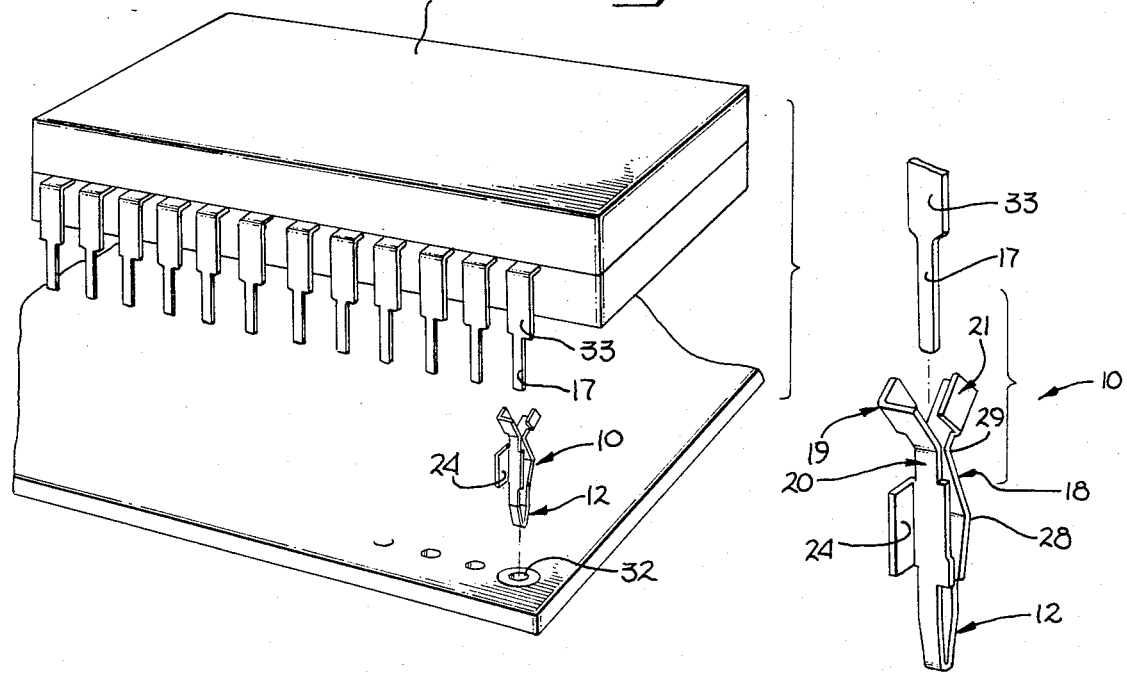
Fig. 1
Fig. 2
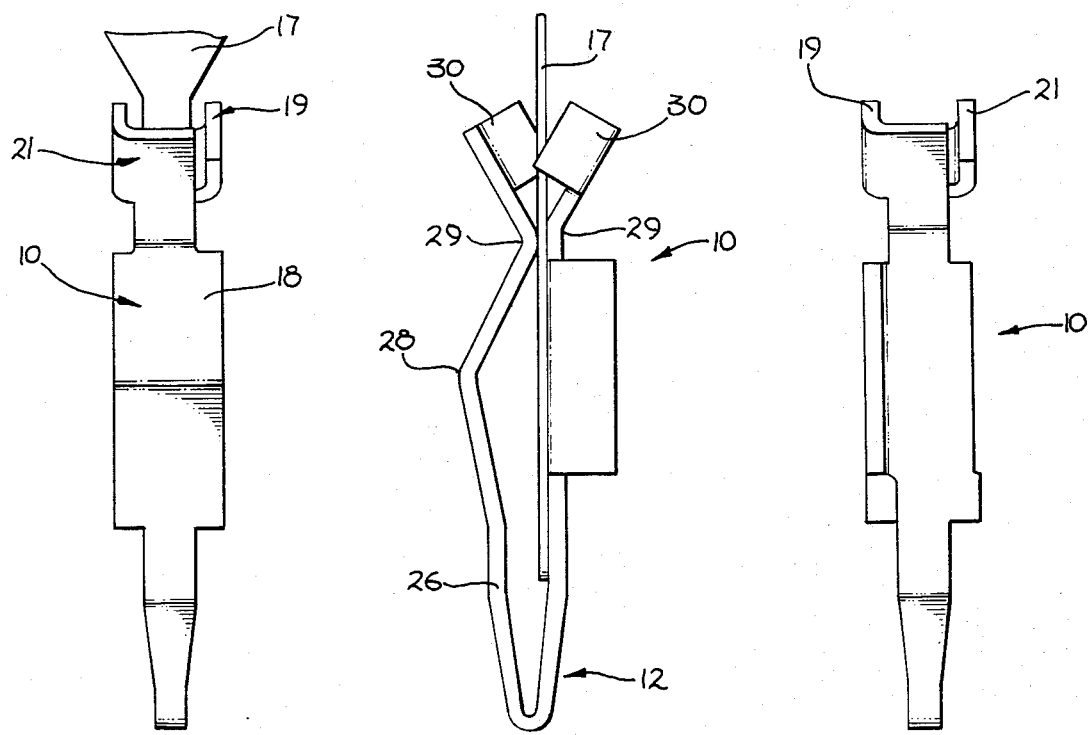
Fig. 3   Fig. 4   Fig. 5

HEAT DISSIPATING LEAD CONNECTOR FOR SEMICONDUCTOR PACKAGES

BACKGROUND OF THE INVENTION

This invention relates to a heat dissipating lead connector for semiconductor packages. It is well known that integrated circuits generate heat during their operation. In addition, intermittent operation may subject the integrated circuit to frequent and large fluctuations in temperature. If the heat generated is not dissipated rapidly, the operational life of the integrated circuit may be shortened substantially. Moreover, a failure to stabilize integrated circuit temperature fluctuations can also have a detrimental effect on integrated circuit life.

Heat dissipation and temperature stabilization is typically achieved by heat transfer that occurs between the surface area of the semiconductor package and the surrounding air. This method for heat dissipation is limited, since the integrated circuit due to its small size and high power capability may generate more heat than its package surface area can properly dissipate.

Separate heat dissipators, known as heat sinks, are available for integrated circuits. They provide increased surface area and a good heat conductive medium to improve heat dissipation. Conventional heat sinks must be mounted to the semiconductor package or other electrical device in a separate operation using solder, screws or other fastening means. See U.S. Pat. Nos. 3,670,215; and 4,073,561. Likewise, the semiconductor package must be mounted to a connector or soldered directly to a circuit board. Thus, the use of conventional heat sinks adds an additional step to the manufacturing process. This increases the manufacturing time and handling required for generating the final product.

It is desirable to provide semiconductor packages housing integrated circuits with a heat dissipating means for improved heat transfer which is integral with the means for mounting the package to the circuit board or the like. Such a device would dissipate the heat generated by an integral circuit before it could be conducted to the circuit board. In addition, because the heat dissipator is located between the semiconductor package and the circuit board, it serves a dual function, protecting both the integrated circuit as well as associated electronic circuitry to which the integrated circuit is electrically coupled.

It is, therefore, a primary object of the present invention to provide a lead connector for improved heat dissipation for integrated circuits that is integral with the means for connecting the integrated circuit to the circuit board.

It is a further object of the invention to provide a lead connector for improved heat dissipation of integrated circuits that can be easily manufactured from a single sheet of metal with a minimum of manufacturing steps at a low cost.

SUMMARY OF THE INVENTION

The heat dissipating lead connector of the present invention is comprised of a unitary strip of metal that can be easily stamped and formed. The body of the connector includes two oppositely facing first and second fingers having free ends which are formed from the unitary strip, by making a 180 degree bend transverse to the longitudinal axis of the strip. A heat dissipating fin is provided which is integral with an edge of the first finger, and protrudes therefrom substantially perpendicular to the vertical centerline of the heat dissipating lead connector body. The fingers are slightly divergent near the base portion of the body defined by the 180 degree bend, and are adapted to engage a mounting hole in a printed circuit board or the like. The central portion of the second finger includes a wider cross-sectional area to facilitate heat transfer, and is bent away from the vertical plane of the body to provide a spring force urging the interior facing surfaces of the upper portion toward the free ends of each finger to grip a semiconductor package lead pin inserted therebetween. Thus, the semiconductor package lead is maintained in place, and thereby provides a good heat and electrically conductive relationship therewith. Integrally formed tabs are formed at the free ends of each finger which extend inwardly and substantially perpendicular to the plane of the body. These tabs assist in securing the package lead to the connector. Heat transmitted from the integrated circuit to a package lead pin is passed to the present invention, and radiated out into the ambient environment.

BRIEF DESCRIPTION OF THE DRAWINGS

FIG. 1 is a perspective view of a heat dissipating semiconductor lead connector embodying the features of the present invention, aligned for mounting with an associated package lead and circuit board mounting hole, which is also illustrated.

FIG. 2 is a perspective view illustrating the alignment of a package lead pin for insertion into the present invention.

FIG. 3 is a rear view of the present invention.

FIG. 4 is a side view of the heat dissipating connector of FIG. 3.

FIG. 5 is a front view of the connector of FIG. 4.

DESCRIPTION OF THE PREFERRED EMBODIMENT

Illustrated in the drawings is a heat dissipating lead connector for dissipating heat from a semiconductor package. In the following description for purposes of explanation, specific numbers, materials and configurations are set forth in order to provide a thorough understanding of the present invention. However, it will be apparent to one skilled in the art that the present invention may be practiced without these specific details.

As generally illustrated in the Figures, a connector body 10 includes a pair of oppositely facing first and second fingers 18 and 20, having free ends 19 and 21. In practice, fingers 18 and 20 are formed from a single strip of metal bent 180 degrees along a line transverse to the longitudinal axis of the strip. As shown, the fingers are slightly divergent at the base portion 12 of the connector body 10.

A substantially rectangular heat transfer fin 24 is integrally formed with an edge of the second finger 20 and extends generally perpendicular to the plane of the second finger. The heat transfer fin 24 is designed with sufficient surface area to provide good heat transfer from the integrated circuit lead 17 to the atmosphere within a minimum of space.

The first finger 18 is provided with a bend 26 such that the first finger 18 diverges away from the opposite finger 20 to approximately the middle of the central portion of the body 10, as best shown in FIG. 4. In addition, a bend 28 is struck such that finger 18 converges on the opposing finger 20, toward the upper portion of the connector body 10. The double bend configuration just described enables the fingers to engage with considerable engaging spring force, the lead connector pin 17 of the semiconductor package. Thus, gripping forces operate normal to the integrated circuit lead 17 at its area of engagement, thereby securely retaining the integrated circuit lead in place and providing a positive electrical and heat conductive relationship between the connector 10 and lead 17. As illustrated in the Figures, the fingers 18 and 20 are provided with a bend 29, and thereby diverge at an angle of approximately 30 degrees from the general longitudinal plane of the integrated circuit lead 17. Integral tabs 30 extend inwardly and perpendicular from the free end of each finger. The tabs 30 provide additional heat transfer area and serve to protect, guide, and retain the integrated circuit lead 17 within the body 10.

Referring to FIGS. 1 and 2, during assembly the base portion 12 of the present invention is pressed into a mounting hole 32 on a printed circuit board or the like. The divergent fingers 18 and 20 detect inwardly as their outer surfaces slide along the edge of the mounting hole 32. Inasmuch as the diameter of the mounting hole is less than the distance between the fingers at the base portion 12 in the undeflected condition, the fingers continuously press outwardly against the edge of the mounting hole thereby maintaining the connector firmly in place.

As shown in FIGS. 2, 3 and 4, the semiconductor lead 17 is pressed between the fingers 18 and 20 by the application of a downward force to the semiconductor package 34, until the upper terminous 33 of the lead 17 is stopped against the tabs 30. Thus, the divergent fingers at the upper body portion of the connector 10 serve as a guide for the smooth and unimpeded installation of the semiconductor lead 17.

Although the present invention has been described and illustrated in the configuration of a single connector, it will be appreciated that each connector 10 may be coupled to other connectors 10 by a strip of electrically insulative material. For example, each connector 10 may be partially encapsulated in plastic to such that only the opposite ends and fin 24 are not covered by the plastic. Thus, the plurality of leads 17 of semiconductor 34 may be simultaneously inserted into each respective connector.

In operation, heat generated by the integrated circuit within the semiconductor package 34 is transferred to each lead 17 extending from the semiconductor package, and thus to the present invention. This thermal energy is in turn transferred through the metal structure of the connector 10 to the fin 24 for more efficient dissipation into the ambient environment.

Thus, a heat dissipating connector for use in conjunction with a semiconductor package has been described. The connector permits the package leads to be easily removed simply by applying an upward force which exceeds the gripping spring force of the fingers 18 and 20. Moreover, the connector may be easily removed from the printed circuit board or the like if required. The present invention provides a simple, durable and efficient means to dissipate heat from an integrated circuit package, thereby extending the useful life of the semiconductor device.

I claim:

1. A heat dissipating connector for coupling a semiconductor package lead to a printed circuit board or the like, comprising:
    a conductive strip of metal having a substantially U-shaped bend transverse to the longitudinal axis of said strip thereby forming a centrally disposed bore for receiving and retaining said lead, and having a pair of oppositely facing fingers providing an inward spring force for compressing said lead between said fingers, and for retaining said connector in a receiving hole, each finger of said pair of opposite facing fingers having a free end, each free end being bent outwardly such that said free ends diverge; and
    an integral fin extending outwardly from said conductive strip along the central portion of the longitudinal edge of at least one of said fingers,
    whereby heat generated by an integrated circuit within a semiconductor package transferred to said lead is dissipated by said connector thru said fin.

2. The connector as claimed in claim 1 further including a bend in one of said oppositely facing fingers such that said finger is biased against its opposing finger for urgently retaining said lead between said opposing fingers.

3. The connector as claimed in claim 1 wherein at least one of said fingers is of increased width near the central portion thereof for providing additional heat transfer surface and for providing a shoulder for abutting against the lip of a receiving hole into which said connector is receivably engaged and supported.

4. The connector as claimed in claim 3, wherein the lower portion of said connector between said bend and said shoulder is tapered for engaging said receiving hole with an interference fit, and wherein said oppositely facing fingers diverge upwardly from said bend at the lower portion of said connector for urgently engaging the side walls of said receiving hole.

5. A heat dissipating connector for coupling a semiconductor package lead to a printed circuit board or the like comprising:
    a conductive strip of metal having a substantially U-shaped bend transverse to the longitudinal axis of said conductive strip such that said conductive strip is substantially bisected thereby forming a centrally disposed bore for receiving and retaining said lead, and thereby forming a pair of oppositely facing fingers, each oppositely facing finger having a free end, said free ends being bent outwardly such that such free ends are divergent;
    at least one of said fingers being of increased width near the central portion of said at least one finger for providing additional heat transfer surface and for providing a shoulder for abutting against the lip of a receiving hole into which said connector is receivably engaged and supported,
    said oppositely facing fingers being upwardly divergent from said bend for urgently abutting the sidewalls of said receiving hole with a selected interference fit; and
    an integral fin extending outwardly from said conductive strip along the central portion of the longitudinal edge of at least one of said fingers, and including a bend in one of said oppositely facing fingers such that said finger is biased against its opposing finger for urgently retaining said lead between said fingers, whereby heat generated by an integrated circuit within a semiconductor package is dissipated by said connector through said fin.

6. The heat dissipating connector as claimed in claim 5 wherein:
   said fin extends perpendicularly from the general plane of at least one of said fingers.

7. The heat dissipating connector as claimed in claim 5 wherein the lower portion of said connector is tapered toward said bend for engaging said receiving hole.

8. The heat dissipating connector as claimed in claim 5 further comprising integral tabs extending inwardly and perpendicularly from the free end of each of said fingers for guide protecting said lead, and for further acting as heat transfer fins thereby enhancing the heat dissipative capability of said connector.

9. The heat dissipating connector as claimed in claim 5 further including a bend in at least one of said oppositely facing fingers such that said at least one finger is biased against its opposing finger for urgently retaining said lead between said opposing fingers.

* * * * *